(12) United States Patent
Shiba et al.

(10) Patent No.: US 7,211,896 B2
(45) Date of Patent: May 1, 2007

(54) SEMICONDUCTOR DEVICE AND METHOD OF MANUFACTURING THE SAME

(75) Inventors: Kazutoshi Shiba, Kanagawa (JP); Hiroyuki Kunishima, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/767,335

(22) Filed: Jan. 30, 2004

(65) Prior Publication Data
US 2004/0183200 A1    Sep. 23, 2004

(30) Foreign Application Priority Data
Jan. 31, 2003   (JP)   ............... 2003-024300

(51) Int. Cl.
  H01L 23/48    (2006.01)
  H01L 29/40    (2006.01)
  H01L 214/763  (2006.01)
  H01L 21/44    (2006.01)

(52) U.S. Cl. ............ 257/756; 257/774; 257/751; 257/762; 438/627; 438/687

(58) Field of Classification Search ................ 257/758, 257/774, 751, 762, 756; 438/627, 687
See application file for complete search history.

(56) References Cited

U.S. PATENT DOCUMENTS

| | | | | |
|---|---|---|---|---|
| 3,818,064 A | * | 6/1974 | Kim ..................... | 556/431 |
| 5,848,687 A | * | 12/1998 | Shultz ................... | 206/308.1 |
| 5,906,859 A | * | 5/1999 | Bremmer et al. ........... | 427/226 |
| 6,074,695 A | * | 6/2000 | Kobayashi et al. .......... | 427/245 |
| 6,149,966 A | * | 11/2000 | Kobayashi et al. ........... | 427/58 |
| 6,214,748 B1 | * | 4/2001 | Kobayashi et al. ......... | 438/782 |
| 6,231,989 B1 | * | 5/2001 | Chung et al. .............. | 428/447 |
| 6,329,490 B1 | * | 12/2001 | Yamashita et al. ........... | 528/42 |
| 6,358,804 B2 | * | 3/2002 | Kobayashi et al. ........ | 438/301 |
| 6,440,550 B1 | * | 8/2002 | Hacker ................... | 428/312.6 |
| 6,472,076 B1 | * | 10/2002 | Hacker ................... | 428/447 |
| 6,558,755 B2 | * | 5/2003 | Berry et al. ............... | 427/489 |
| 6,576,300 B1 | * | 6/2003 | Berry et al. ............... | 427/489 |
| 6,576,345 B1 | * | 6/2003 | Van Cleemput et al. ..... | 428/447 |

(Continued)

FOREIGN PATENT DOCUMENTS

JP    2001-176965 A    6/2001

OTHER PUBLICATIONS

Duane Bujalski et al., Compositional And strcutural Analysis of .. Resin, Dec. 2002, Macromolecules, 2003, 36 pp. 180-917.*

(Continued)

*Primary Examiner*—Howard Weiss
*Assistant Examiner*—Shrininvas H. Rao
(74) *Attorney, Agent, or Firm*—Sughrue Mion, PLLC

(57) ABSTRACT

There is provided a method of manufacturing a semiconductor device in which interconnect capacitance is restrained. The semiconductor device 200 comprises a semiconductor substrate; a second interconnect insulating film 216 constituted of a ladder-type hydrogen siloxane formed on the semiconductor substrate; a second protection film 217 provided on the second interconnect insulating film 216; and an upper interconnect 270 formed in the second interconnect insulating film 216 and the second protection film 217. The second interconnect insulating film 216 is constituted of for example an L-Ox™ (trademark) film, and the second protection film 217 is constituted of for example a silicon oxide film.

9 Claims, 16 Drawing Sheets

U.S. PATENT DOCUMENTS

| | | | |
|---|---|---|---|
| 6,663,902 B1 * | 12/2003 | Hei et al. | 424/661 |
| 6,696,352 B1 * | 2/2004 | Carr et al. | 438/458 |
| 2004/0046261 A1 * | 3/2004 | Ohto et al. | 257/774 |
| 2004/0195582 A1 * | 10/2004 | Tomita et al. | 257/127 |
| 2005/0049382 A1 * | 3/2005 | Lyu et al. | 528/35 |

OTHER PUBLICATIONS

Masafumi Unno et al., "Synthesis ands Characterization Of Cage and Bicyclic Silsequioxanes..Silanols", 1999, Applied organometallic chemisrty 13, pp. 303-310.*

* cited by examiner

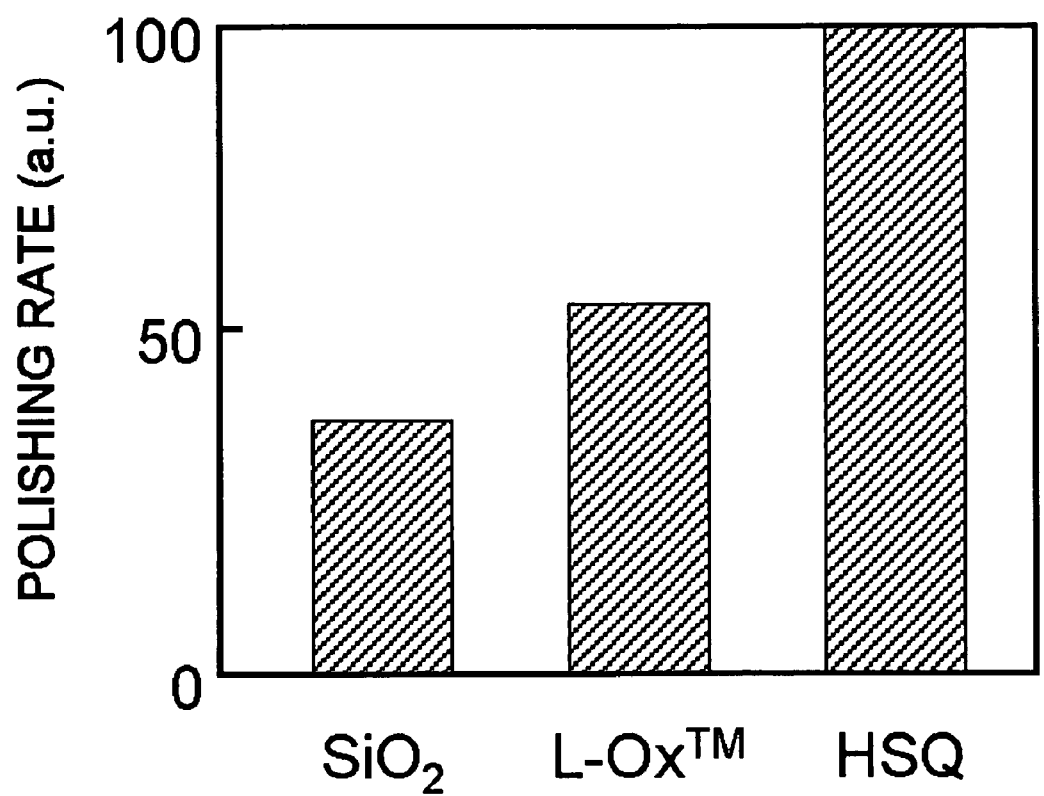

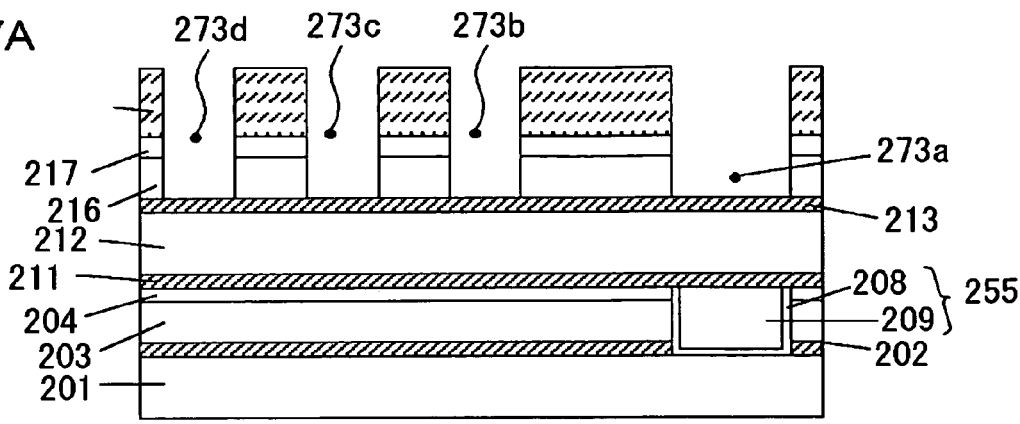
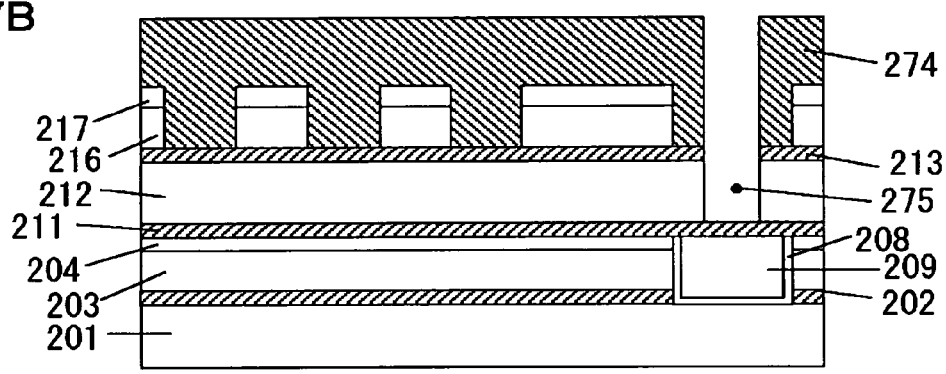
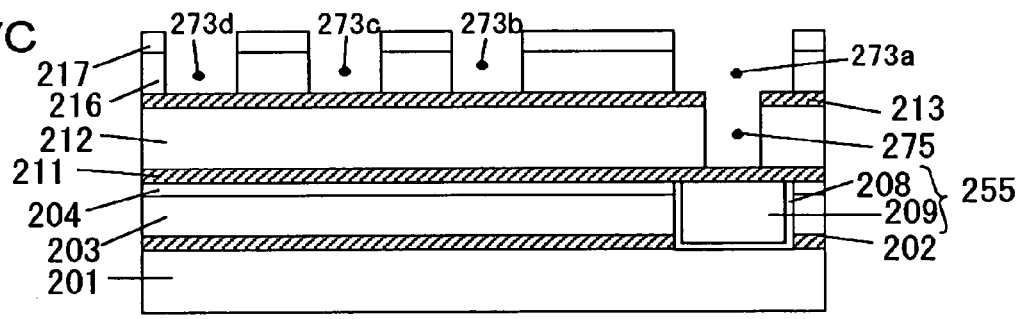
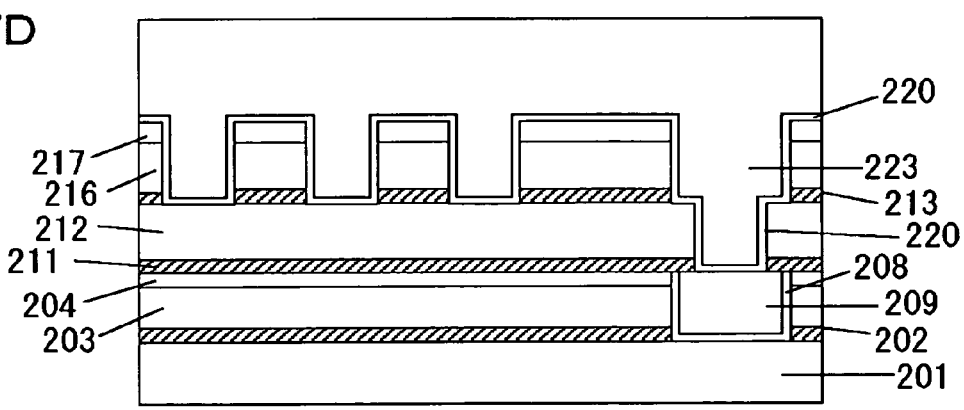

FIG. 12

| | |
|---|---|
| DIELECTRIC CONSTANT (@1MHz) | 2.9 |
| REFRACTIVE INDEX (@633nm) | 1.39 |
| STRESS (dyne/cm$^2$) | 7.00E+08 |
| HARDNESS (GPa) | 0.9 |
| ELASTIC MODULUS (GPa) | 6 |
| THERMAL EXPANSION COEFFICIENT (ppm/deg-C) | 18 |
| GLASS TRANSITION TEMPERATURE (deg-C) | none |
| THERMAL CONDUCTIVITY (W/m·K @25 deg-C) | 0.31 |

SEMICONDUCTOR DEVICE AND METHOD OF MANUFACTURING THE SAME

This application is based on Japanese patent application NO. 2003-024300, the content of which is incorporated hereinto by reference.

BACKGROUND OF THE INVENTION

1. Field of the Invention

The present invention relates to a semiconductor device including an interconnect insulating film constituted of a low dielectric constant film and to a method of manufacturing the same, more specifically to a semiconductor device including a concentrated region where a plurality of interconnects is closely formed, and to a manufacturing method thereof.

2. Description of the Related Art

Recent progress in micronization and in operating speed of a semiconductor device has made it indispensable to employ so-called a low dielectric constant film in combination with a copper interconnect. As a method of forming a copper interconnect, Damascene process is generally employed, which basically consists of forming an interconnect trench in an interconnect insulating film, burying copper in the trench, and removing surplus copper outside the trench by CMP (chemical mechanical polishing) process (JP-A laid open 2001-176965).

However the Damascene process has a drawback that a part of the interconnect insulating film is also removed by CMP method performed after burying copper, because of which interconnect resistance increases or becomes unstable. Generally a low dielectric constant film has lower chemical resistance and less mechanical strength than an $SiO_2$ film conventionally used as an interconnect insulating film. Accordingly, an interconnect insulating film made of a low dielectric constant material is more prone to be scraped off by CMP than that made of an $SiO_2$ film.

This problem will be described in detail referring to FIGS. 1A and 1B. In FIG. 1A, on a lower insulating layer 1 an etch-stopper film 2 made of for example an SiN film is formed, over which an interconnect insulating film 3, for example made of an HSQ film, is formed. On the interconnect insulating film 3, a barrier film 5 constituted of for example Ta, TaN, Ti, TiN or layers thereof, and an interconnect 4 constituted of an interconnect metal film 6 such as Cu are formed. On the interconnect insulating film 3 and the interconnect 4 an insulative etch-stopper film 7 made of for example an SiN film is formed, on which an interlayer insulating film 8 of for example SiO2 is formed, and further on the interlayer insulating film 8 another etch-stopper film 9 of for example SiN, and then another interconnect insulating film 10 made of for example an HSQ film is formed on the etch-stopper film 9. On these films 7 to 10, another barrier film 12 constituted of for example Ta, TaN, Ti, TiN or multiple layers thereof, and a via and an interconnect made of an interconnect metal film 13 such as Cu are formed.

Under the Damascene process, an excess of the interconnect metal film 13 and of the barrier film 12 deposited on the interconnect insulating film 10 are removed by CMP method. Here, an HSQ film having a cage-type molecular structure may be cited as an example of a low dielectric constant material having a dielectric constant not greater than 3.6. However, in the event of employing the HSQ film as an interconnect insulating film, the film is largely scraped off during a CMP process of removing an excess of the interconnect metal film 13 and so on, because of the lack of chemical resistance and mechanical strength. Consequently, in case where HSQ is used as the interconnect insulating film 11, a considerable portion of the interconnect insulating film 11 is removed especially in a concentrated region where the interconnects are closely formed, and an extensive erosion region 14 is formed as shown in FIG. 1B.

SUMMARY OF THE INVENTION

The present invention has been conceived in view of the foregoing situation, with an object to provide a technique of improving erosion resistance in a semiconductor device that has a metal interconnect formed through the Damascene process, or in a method of manufacturing the same. It is another object of the present invention to provide a technique of reducing dispersion of interconnect resistance and interconnect capacitance without increasing an effective dielectric constant.

According to the present invention, there is provided a semiconductor device comprising a semiconductor substrate; a low dielectric constant film constituted essentially of a ladder-type hydrogen siloxane provided on the semiconductor substrate; a protection film provided on the low dielectric constant film; and a metal interconnect formed in the low dielectric constant film and the protection film.

Here, the low dielectric constant film (hereinafter simply referred to as "low-k film") may be defined as a film constituted of a material having a specific dielectric constant not greater than 3.6, more preferably 2.9 or lower. As a ladder-type hydrogen siloxane, for example an L-Ox™ (trademark) (hereinafter simply referred to as "L-Ox") may be used. With such constitution, interconnect capacitance can be reduced, while upgrading erosion resistance.

FIG. 2 is a bar graph showing difference in polishing rate of the relevant materials based on an amount polished off. The graph shows an $SiO_2$ (silicon oxide) film, an HSQ film having a cage-type molecular structure and an L-Ox film having a ladder-type molecular structure, for comparison purpose. As is apparent in view of the graph, a polishing rate of the HSQ film is evidently faster than that of the $SiO_2$ film. A polishing rate of the L-Ox film is significantly slower than that of the HSQ film, though faster than that of the $SiO_2$ film.

FIGS. 3A and 3B are comparative bar graphs showing changes of an HSQ film having a cage-type molecular structure and an L-Ox film against various kinds of treatments. As shown in FIG. 3A, the molecular bond structure of the HSQ film has remarkably changed by $O_2$ plasma treatment and wet cleaning. This proves that the HSQ film having a cage-type molecular structure is chemically unstable. Therefore, even though a protection film is provided, interconnect thickness may still be reduced or uneven because of erosion during a polishing and removing process of metal interconnects especially in a concentrated region where the metal interconnects are closely formed, unless the protection film is sufficiently thick. However, in case of employing an $SiO_2$ film as the protection film, since a specific dielectric constant of the $SiO_2$ film is normally around 4.2, forming a generously thick protection film with such material increases an effective dielectric constant, thereby spoiling the advantage of employing a low-k film as the interconnect insulating film.

On the other hand, it has been proven that the molecular bond structure of the L-Ox film does not significantly change by $O_2$ plasma treatment or wet cleaning as shown in FIG. 3B. Accordingly, employing an L-Ox film improves erosion resistance, even when the protection film is thinly formed.

In the semiconductor of the present invention, the protection film may be constituted of a material having greater resistance against a chemical mechanical polishing process than the low-k film.

As a result of such constitution, resistance against erosion that may take place during a chemical mechanical polishing process for forming the metal interconnect can be upgraded since the protection film is provided on the low-k film. Here, the protection film may be constituted essentially of a silicon oxide film. A silicon oxide film effectively serves as the protection film because of having a slower polishing rate than an L-Ox film does, as already proven.

In the semiconductor device of the present invention, the ladder-type hydrogen siloxane may have a refractive index not less than 1.38 but not greater than 1.40 at a wavelength of 633 nm. In the semiconductor device of the present invention, the ladder-type hydrogen siloxane may have a density not less than 1.50 g/cm$^3$ but not greater than 1.58 g/cm$^3$. Also, in the semiconductor device of the present invention, the ladder-type hydrogen siloxane may be formed through sintering in a temperature range of 200 to 400 degree centigrade.

In the semiconductor device of the present invention, a plurality of said metal interconnects may be provided so as to form an isolated region where one of the plurality of metal interconnects is separately located and a concentrated region where the other metal interconnects are closely disposed to one another.

In the semiconductor device of the present invention, the plurality of metal interconnects in the concentrated region may be disposed such that a maximum interval between substantially parallel portions of neighboring metal interconnects is not greater than a double of a width of the respective metal interconnects.

Such concentrated region is where erosion is more likely to take place, therefore providing the low-k film constituted of a ladder-type hydrogen siloxane and the protection film formed thereon results in higher erosion resistance. Meanwhile, a lower limit of the interval between metal interconnects is not specifically defined, however it is preferable to set the lower limit for example at 25% of a width of the respective metal interconnects, because an effective interconnect structure is normally formed in such range. Though erosion is more prone to take place as the interval between interconnects becomes narrower, it is evident that the advantage of upgraded erosion resistance can equally be obtained even when the interval between interconnects is made narrower.

Also, the present invention is applicable to a semiconductor device having an interconnect structure formed by single Damascene process, as well as that including an interconnect structure formed by dual Damascene process. Referring further to the dual Damascene process, the present invention is applicable to the trench-first process of forming an interconnect trench at first, the via-first process of forming a via hole at first, and also to the middle-first process of forming an etching stopper film for disposing a via hole first, and forming an interconnect trench before forming a via hole. Further, the present invention is applicable to a semiconductor device including an interconnect structure formed by various other process than the mentioned ones.

In the semiconductor device of the present invention, the protection film may be formed such that a film thickness thereof at its thickest portion is in a range of 10% to 30% of a film thickness of the low dielectric constant film at its thickest portion.

As a result of defining a lower limit of the film thickness of the protection film as above, performance by the protection film of improving erosion resistance is fully secured. Likewise, with the above specified upper limit of the protection film thickness, erosion resistance can be upgraded without reducing an effect of lowering a dielectric constant intended through employing a low-k film as the interconnect insulating film.

FIG. 16 is a line graph showing a relation between a film thickness ratio (%) and an increase of interconnect capacitance in case where an SiO$_2$ film is used as a protection film and an L-Ox film is used as a low-k film. In FIG. 16, the line shown as "with etching stopper" represents an increase of the interconnect capacitance according to a change of the SiO$_2$ film thickness, under a fixed condition that a film thickness of an etch-stopper film 213 is 50 nm and that of a second interconnect insulating film 216 is 240 nm in a semiconductor device shown in FIG. 4 to be subsequently described. Likewise, the line shown as "without etching stopper" represents an increase of the interconnect capacitance according to a change of the SiO$_2$ film thickness, under a fixed condition that a film thickness of a second interconnect insulating film 216 is 290 nm in a semiconductor device shown in FIG. 4 but without the etching stopper film 213. In both cases, width of an upper interconnect 270 is set at 0.20 µm, and an interval between interconnects at 0.2 µm. As a result of restraining a film thickness of the protection film at its thickest portion not to exceed 30% of a film thickness of the low-k film at its thickest portion in this way, an increase of interconnect capacitance can be restrained to remain within 5% with respect to a case where the protection film is not provided, therefore erosion resistance can be improved maintaining the advantage of a lowered dielectric constant.

The semiconductor device of the present invention can be built up to a multilayer interconnect structure constituted of a plurality of layers including a metal interconnect and an interconnect insulating film consisting of a low-k film and a protection film. According to the present invention since erosion resistance of the respective interconnect insulating films is upgraded, the respective layers can be better planarized, and consequently a multilayer interconnect structure can be precisely and stably formed upon laminating a plurality of such layers.

In the semiconductor device of the present invention, the protection film may be provided over the low dielectric constant film in direct contact therewith. In case of employing a ladder-type hydrogen siloxane as the low-k film and a silicon oxide film as the protection film, close adhesion is achieved between these films, which is another factor that improves erosion resistance. Also, the protection film does not necessarily have to be in direct contact with the low-k film, but an intermediate layer (or film) may be provided between those films.

According to the present invention, there is provided a method of manufacturing a semiconductor device comprising forming a low dielectric constant film constituted essentially of a ladder-type hydrogen siloxane on a semiconductor substrate; forming a protection film on the low dielectric constant film; forming a metal interconnect in the low dielectric constant film and the protection film; and polishing the metal interconnect with the protection film provided on the low dielectric constant film.

By such method, erosion resistance during the polishing process of forming the metal interconnect is improved, since the protection film is provided on the low-k film. Here, the protection film may be formed of a silicon oxide film.

The method of manufacturing a semiconductor device of the present invention may further comprise forming an interconnect trench in an interconnect insulating film; burying an interconnect metal film in the interconnect trench in the step of forming the metal interconnect; and polishing and removing the interconnect metal film outside the interconnect trench in the step of polishing the metal interconnect.

The method of manufacturing a semiconductor device of the present invention may further comprise forming an interlayer insulating film on the protection film after the step of polishing; polishing and planarizing the interlayer insulating film; and repeating the respective steps to thereby form a multilayer interconnect structure.

According to the present invention, since erosion resistance in the respective interconnect insulating films is upgraded, the respective layers can be better planarized, and by laminating a plurality of such layers a multilayer interconnect structure can be formed at a higher precision level that can be stably maintained.

BRIEF DESCRIPTION OF THE DRAWINGS

FIG. 2 is a bar graph showing difference of polishing rate of different materials based on an amount polished off;

FIGS. 7A to 7D are schematic cross-sectional views showing a formation process of an upper interconnect layer of the semiconductor device of FIG. 6;

FIG. 12 is a table showing property data of L-Ox;

DETAILED DESCRIPTION OF THE INVENTION

In the embodiments of the present invention, an interconnect insulating film in which an interconnect is to be formed includes a low-k film constituted of a ladder-type hydrogen siloxane.

A structure of a ladder-type hydrogen siloxane film will be described hereunder.

A ladder-type hydrogen siloxane refers to a polymer that has a ladder-type molecular structure, and it is preferable to employ such one that has a dielectric constant not greater than 2.9 and a low film density, from the viewpoint of prevention of an interconnect delay. Specifically, it is preferable that the film density is not less than 1.50 $g/cm^3$ but not greater than 1.58 $g/cm^3$, and a refractive index is not less than 1.38 but not greater than 1.40 at a wavelength of 633 nm. An L-Ox™ (trademark) called a ladder oxide can be cited as a specific example of such film material. Also, the porus L-Ox may be used as the insulating material.

Figure 11:
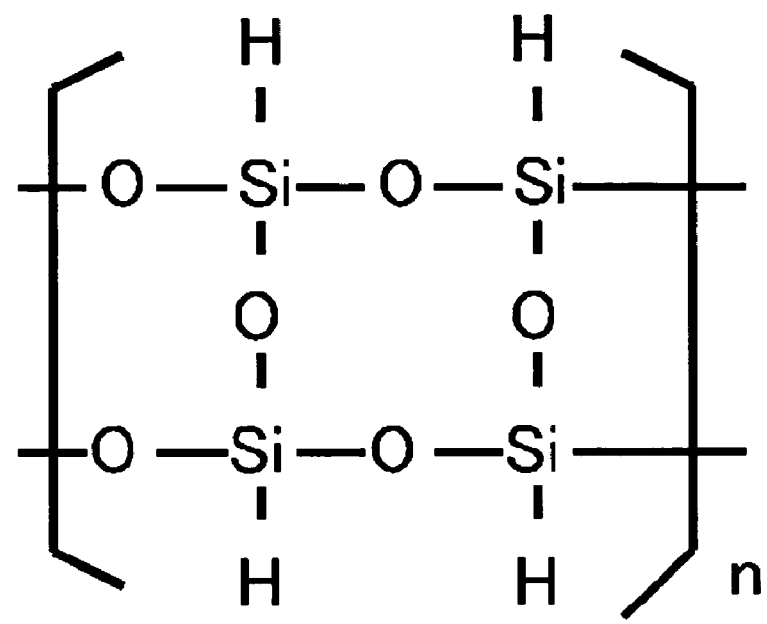
FIG. 11 is a schematic diagram showing a structure of L-Ox™ (trademark) having a ladder-type hydrogen siloxane structure.

FIG. 11 shows a structure of an L-Ox having a ladder-type hydrogen siloxane structure. In the drawing, n is a positive numeral not less than 1. Property data of the L-Ox having such structure is shown in FIG. 12.

Figure 13:
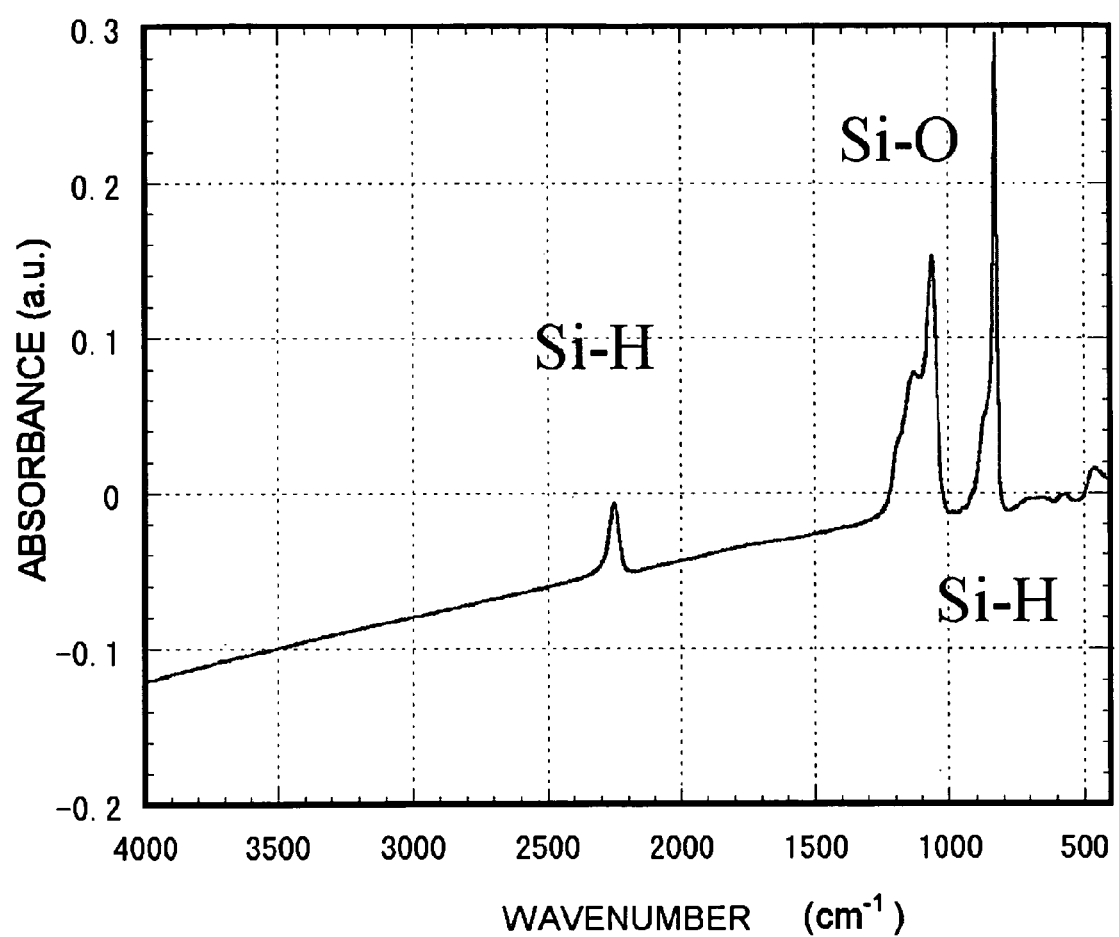
FIG. 13 is a line graph showing an IR (infrared) spectrum of L-Ox.

A measurement result by FT-IR (Fourier Transform Infrared Spectroscopy) shown in FIG. 13 proves that the L-Ox actually has the structure shown in FIG. 11. The chart of FIG. 13 characteristically shows a sharp Si—H bond that can be observed around 830 $cm^{-1}$, and the steepness of the spectrum suggests that the L-Ox has a two-dimensional structure. Also, an extremely small peak that is supposed to be another peak of the Si—H bond is observed at a higher wave number side close to 870 $cm^{-1}$, which endorses that the object of measurement has a two-dimensional structure.

Property of an L-Ox changes also depending on a sintering condition. This aspect will be described referring to FIG. 14.

Figure 14:
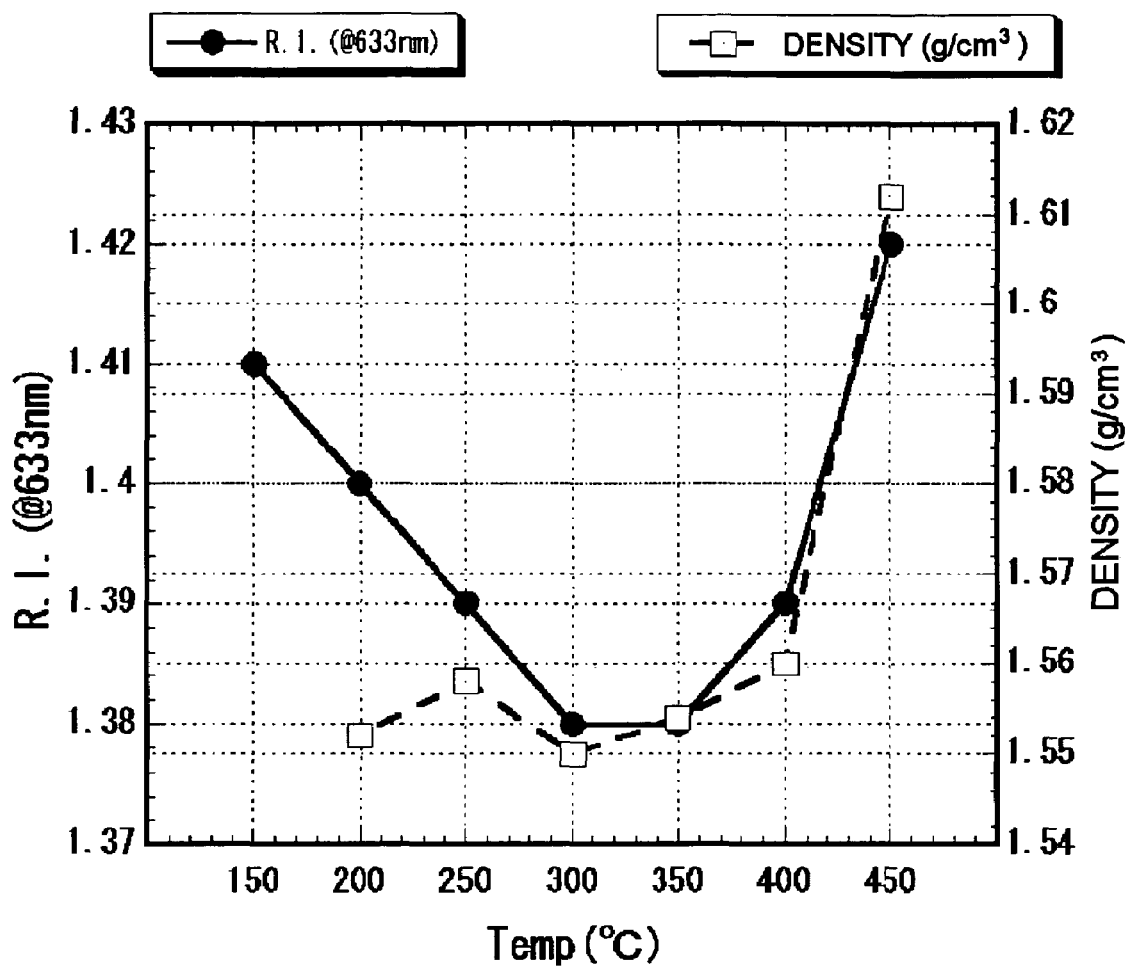
FIG. 14 is a line graph showing a refractive index and a density of sintering condition dependence of L-Ox.

An L-Ox that has been sintered in an inert gas atmosphere such as nitrogen at a temperature of 200 to 400 degree centigrade has following characteristics. Referring to FIG. 14, R.I. designates a refractive index at a wavelength of 633 nm. The refractive index, which is a parameter that directly affects a dielectric constant, is changing in a range of 1.38 to 1.40. At a temperature below 200 degree centigrade or over 400 degree centigrade, the refractive index indicates a value higher than 1.40.

Referring to density, an L-Ox sintered at a temperature of 200 to 400 degree centigrade indicates 1.50 to 1.58 $g/cm^3$. At a temperature higher than 400 degree centigrade, the value exceeds 1.60 $g/cm^3$. At a temperature below 200 degree centigrade, density was not measurable.

Also, at a temperature below 200 degree centigrade, a bond supposed to be an Si—OH (silanol) was observed around 3650 $cm^{-1}$ by FT-IR. At a sintering temperature higher than 400 degree centigrade, the density prominently increases.

Based on the foregoing data, it is understood that a low dielectric constant L-Ox provided with excellent characteristics can be stably obtained through a sintering process at an atmospheric temperature of 200 to 400 degree centigrade when depositing a insulating film including the L-Ox.

Figure 15:
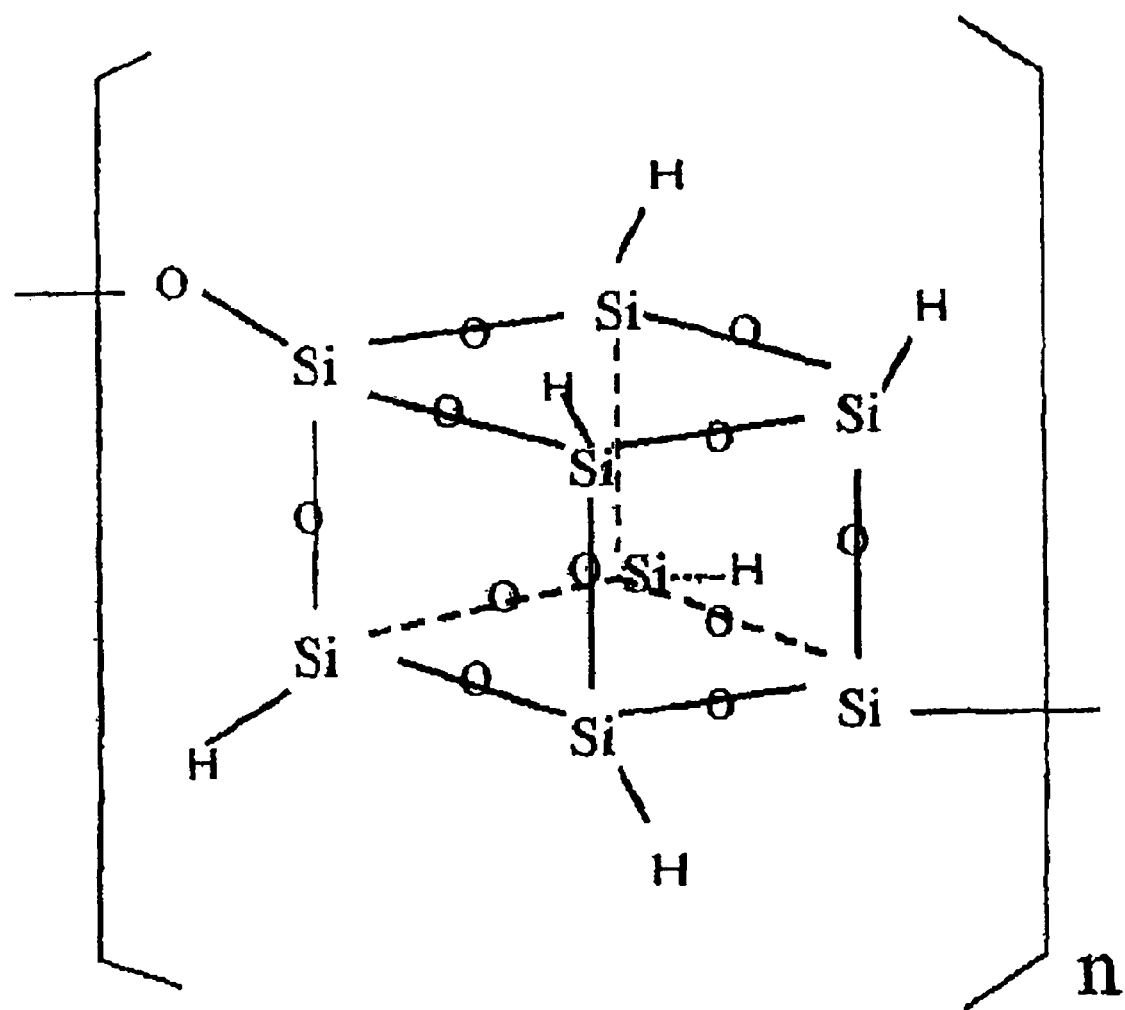
FIG. 15 is a schematic diagram showing a molecular structure of HSQ.
Figure 16:
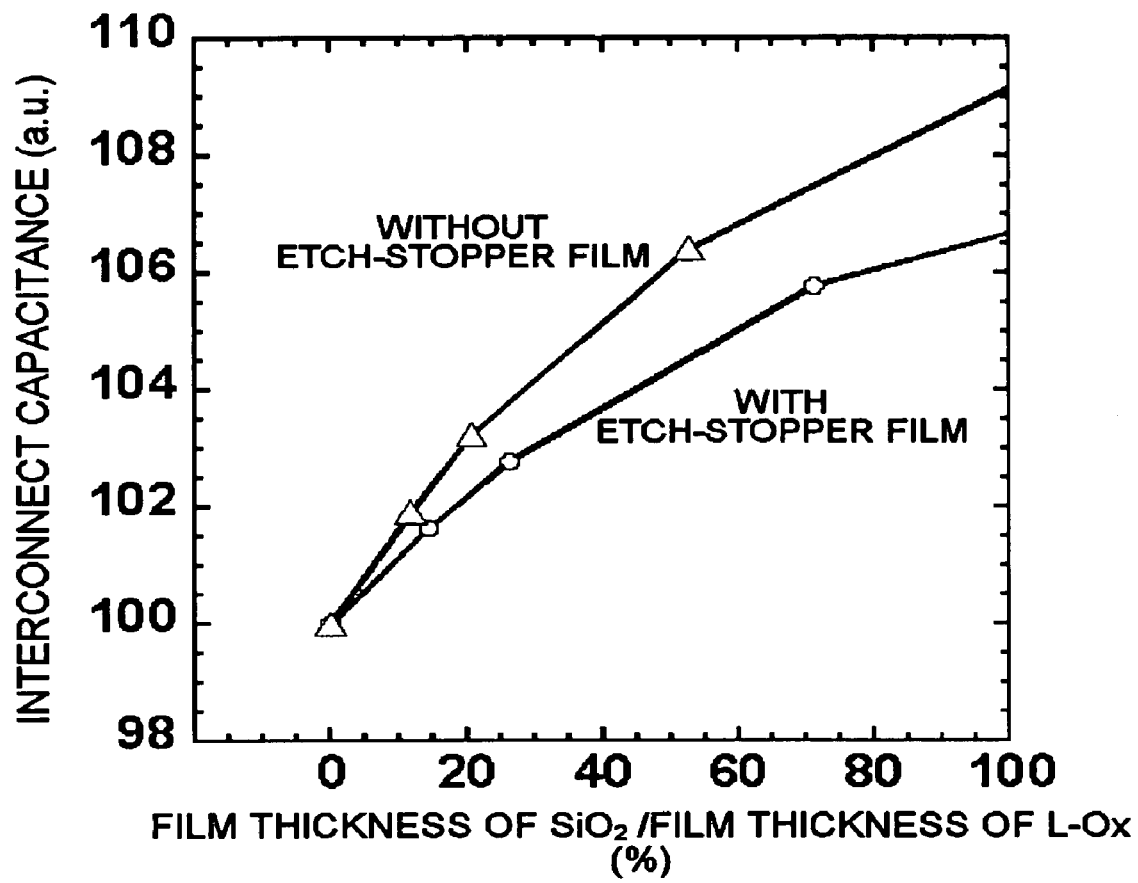
FIG. 16 is a line graph showing a relation between a film thickness ratio (%) of an $SiO_2$ film against an L-Ox film, and an increase of interconnect capacitance in case where an $SiO_2$ film is used as a protection film and an L-Ox film is used as a low-k film.

FIG. 15 shows a conventionally known molecular skeleton of HSQ (Hydrogen Silsesquioxane) of a hydrogen siloxane structure having a three-dimensional cage-type molecular structure (cited from "Semiconductor Technology Outlook" 1998 edition, pages 431 to 435).

Significant difference in film stability during a manufacturing process is observed with respect to these two materials, of which the L-Ox shows prominently superior film stability. The reason is considered to be a lower Si—H reduction of the L-Ox than the HSQ. Also, difference of bonding mode of hydrogen atoms in the insulating film is considered to be another reason. Specifically, while a hydrogen atom is connected to a corner of the cubic structure of the HSQ, in case of the L-Ox a hydrogen atom is connected to a lateral portion of the ladder structure. Accordingly, density around a hydrogen atom of the HSQ is lower and consequently the hydrogen bond of the HSQ is more reactive than that of the L-Ox.

First Embodiment

The first embodiment represents a case where the present invention is applied to formation of a multilayer interconnect structure by single Damascene process.

Figure 4:
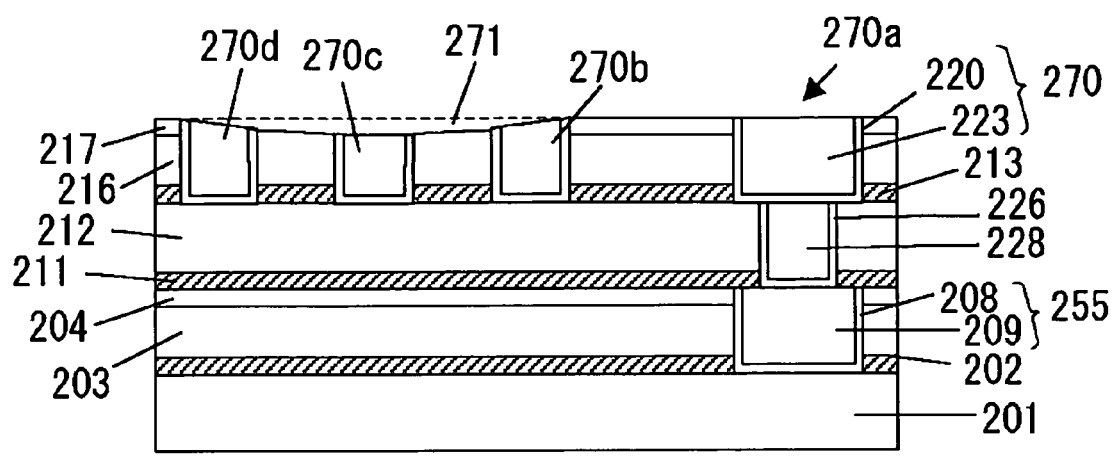
FIG. 4 is a schematic cross-sectional view showing a semiconductor device according to an embodiment of the present invention.

FIG. 4 is a schematic cross-sectional view showing a semiconductor device according to the first embodiment.

In the semiconductor device 200 according to this embodiment, a lower interconnect 255 is connected to an upper interconnect 270 through a via plug.

The lower interconnect 255 is disposed in a trench formed in film layers. The trench is formed in film layers consisting of an underlying insulating film 201 deposited on a semiconductor substrate (not shown), an etch-stopper film 202 constituted of for example an SiC or SiCN film, a first interconnect insulating film 203 constituted of an L-Ox film 203 which is a ladder-type hydrogen siloxane, and a first protection film 204 constituted of an SiO$_2$ film. A lateral wall and a bottom portion of the lower interconnect 255 are covered with a barrier film 208 constituted of for example Ta, TaN, Ti, TiN or layers thereof. The L-Ox film is a ladder-type hydrogen siloxane called a ladder oxide, as already stated.

The via plug is formed in a bore provided in film layers consisting of an etch-stopper film 211 which is an SiCN film formed over the first protection film 204 and an interlayer insulating film 212 which is an SiO$_2$ film. A lateral wall and a bottom portion of the bore are covered with a barrier film 226 which is a Ta/TaN film, and inside of the barrier film is filled with a via metal film 228 which is a copper film.

The upper interconnect 270 is disposed in a trench formed in film layers. The trench is formed in film layers consisting of an etch-stopper film 213 constituted of an SiCN film, a second interconnect insulating film 216 constituted of an L-Ox film, and a second protection film 217 constituted of an SiO$_2$ film. A lateral face of the upper interconnect 270 is covered with a barrier film 220 which is a Ta/TaN film, and inside of the barrier film is filled with an interconnect metal film 223 which is a copper film.

The upper interconnect 270 includes an isolated interconnect 270a and a plurality of concentrated interconnects 270b, 270c and 270d that are disposed close to one another. In a concentrated region where the concentrated interconnects 270b to 270d are disposed, an erosion region 271 is supposed to be formed.

Now, the second interconnect insulating film 216 may be formed in a thickness of approx. 200 nm, and the upper interconnect 270 in a width of approx. 0.20 μm, for example. Meanwhile, a minimum interval between interconnects in the concentrated region where the concentrated interconnects 270b to 270d are formed is to be approx. 0.40 μm. In this case, it is preferable that the second protection film 217 is formed such that a thickest portion thereof in the proximity of a region where the isolated interconnect 270a is formed becomes 30 nm to 70 nm. Otherwise, it is also possible to design, for example, such that the upper interconnect 270 has a width of 0.60 μm with the interval between interconnects of 0.20 μm, and though in such case erosion is prone to take place, by employing an L-Ox film as the second interconnect insulating film 216 erosion resistance can be upgraded.

Also, in case of forming the second interconnect insulating film 216 on an upper layer, a minimum interval between interconnects in the concentrated region where the concentrated interconnects 270b to 270d are formed may be set at approx. 0.80 μm. In this case, the second interconnect insulating film 216 may be formed in a thickness of approx. 350 nm and the upper interconnect in a width of approx. 0.40 μm. In this case, it is preferable that the second protection film 217 is formed such that a thickest portion thereof in the proximity of a region where the isolated interconnect 270a is formed becomes 70 nm to 125 nm. Otherwise, it is also possible to design, for example, such that the upper interconnect 270 has a width of 1.60 μm with the interval between interconnects of 0.40 μm, and though in such case erosion is prone to take place, by employing an L-Ox film as the second interconnect insulating film 216 erosion resistance can be upgraded.

Hereunder, a method of manufacturing the semiconductor device according to this embodiment will be described. FIGS. 5A to 5D are schematic cross-sectional views showing a formation process of an upper interconnect layer of the semiconductor device of FIG. 4. In these drawings the components formed lower than the interlayer insulating film 212 are omitted, and the barrier film 226 and the via metal film 228 shown in FIG. 4 are omitted in the interlayer insulating film 212.

Figure 5A:
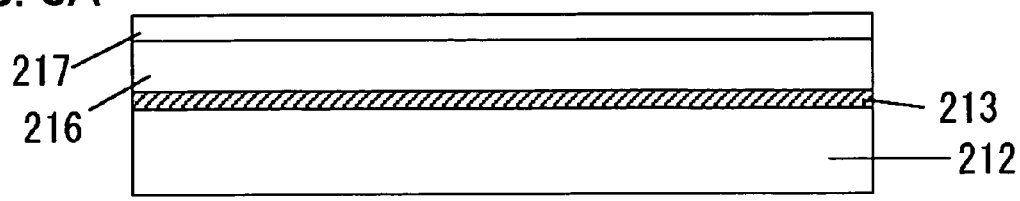
FIGS. 5A to 5D are schematic cross-sectional views showing a formation process of an upper interconnect layer of the semiconductor device of FIG. 4.

A first step is, for example, forming an etch-stopper film 213 on the interlayer insulating film 212, forming thereon the second interconnect insulating film 216 (film thickness 250 nm for example), and forming thereon the second protection film 217 (FIG. 5A). Here, a film thickness of the second protection film 217 is preferably in a range of 10% to 60%, more preferably approx. 50% of a film thickness of the second interconnect insulating film 216.

Figure 5B:
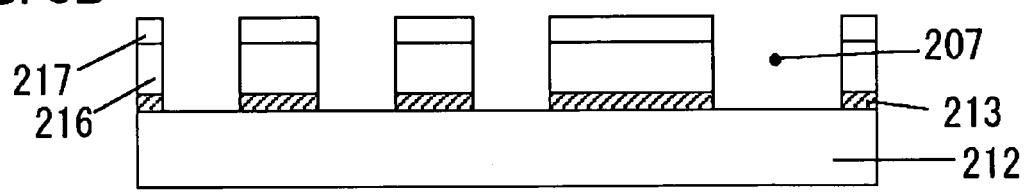

Following the above the interconnect trench 207 is formed through the etch-stopper film 213, the second interconnect insulating film 216 and the second protection film 217, by a known lithography and etching technique (FIG. 5B).

Figure 5C:
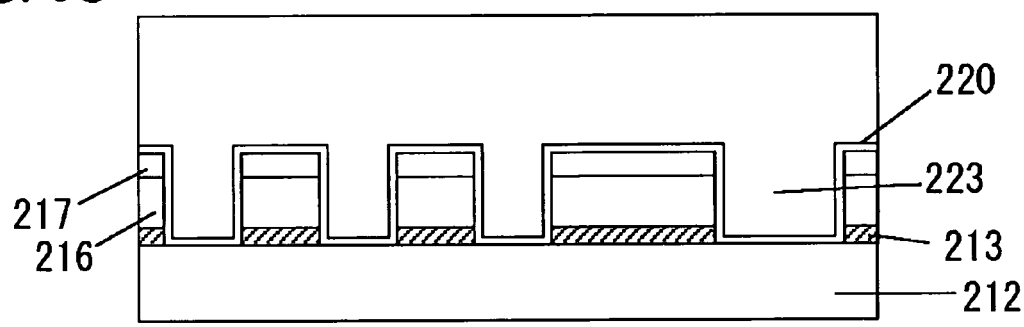

Then the barrier film 220 is formed in the interconnect trench 207 by sputtering, and the interconnect metal film 223 is formed on the barrier film 220 so as to fill in the interconnect trench 207, for example by electrolytic plating (FIG. 5C).

Figure 5D:
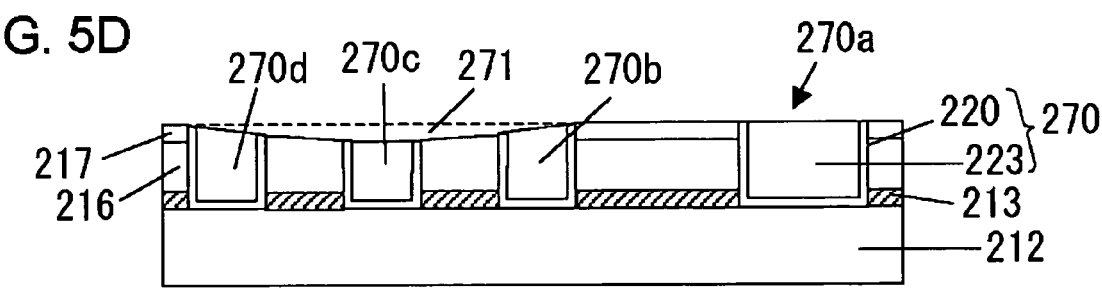

Thereafter, an excess of the barrier film 220 and of the interconnect metal film 223 formed outside the interconnect trench 207 is removed by CMP. At this stage, the isolated interconnect 270a and the concentrated interconnects 270b to 270d are formed (FIG. 5D). During the CMP process a portion of the second protection film 217 and of the second interconnect insulating film 216 is removed, and especially in the concentrated region where the concentrated interconnects 270b to 270d are formed the second protection film 217 and the second interconnect insulating film 216 are scraped off in a larger scale, than in a region around the isolated interconnect 270a. However since an L-Ox film which has high polishing resistance is used as the second interconnect insulating film 216 in this embodiment, dimensions of the erosion region 271 where the second protection film 217 and the second interconnect insulating film 216 are scraped off can be reduced. Here, it is preferable to form the second protection film 217 such that its film thickness becomes 10% to 30% of a thickest portion of the second interconnect insulating film 216 after the CMP process.

By repeating the foregoing process of forming an interconnect and of providing a via on the interconnect for electrical connection thereof, manufacturing by single Damascene process of a semiconductor device provided with a multilayer interconnect structure including a desired number of layers can be executed.

According to this embodiment, since employing an L-Ox film as an interconnect insulating film increases polishing resistance thereof, erosion resistance can be upgraded despite reducing a thickness of a protection film formed on the interconnect insulating film constituted of a low-k material.

Second Embodiment

The second embodiment represents a case where the present invention is applied to formation of a multilayer interconnect structure by dual Damascene process. Hereunder the "trench-first" process is adopted as an example of forming an interconnect and a via. In this embodiment, the same numerals are given to components that are identical to those of the first embodiment, and description thereof may be omitted.

Figure 6:
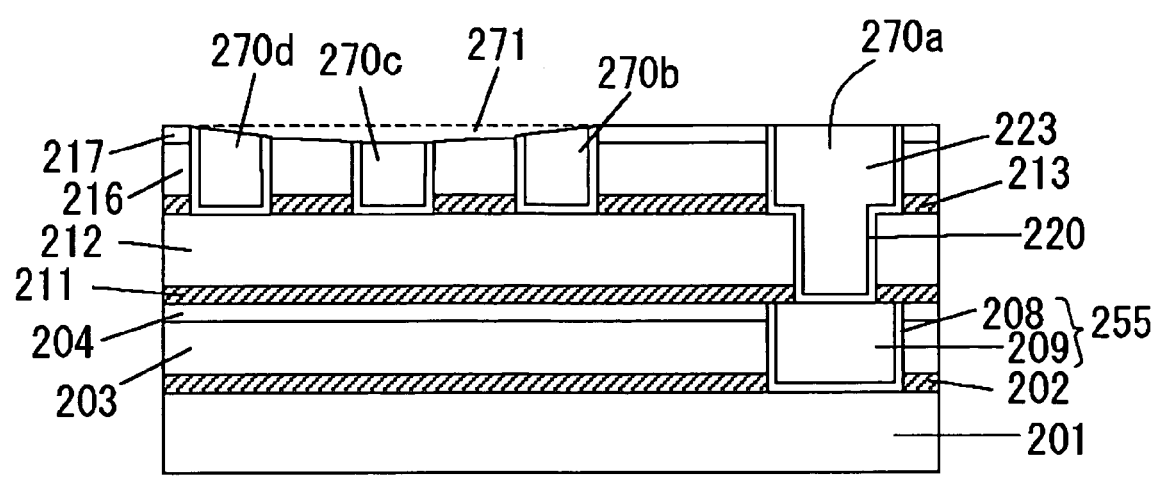
FIG. 6 is a schematic cross-sectional view showing a semiconductor device according to another embodiment of the present invention.

FIG. 6 is a schematic cross-sectional view showing a semiconductor device according to the second embodiment.

In this embodiment the semiconductor device 200 has, as in the first embodiment, a multilayer structure constituted of the underlying insulating film 201, etch-stopper film 202, first interconnect insulating film 203, first protection film 204, etch-stopper film 211, interlayer insulating film 212, etch-stopper film 213, second interconnect insulating film 216 and second protection film 217 layered in this sequence. Also, the lower interconnect 255 constituted of the barrier film 208 and the interconnect metal film 209 is formed through the first interconnect insulating film 203, the first protection film 204 and the etch-stopper film 211. The barrier film 220 and the interconnect metal film 223 are formed through the etch-stopper film 211, interlayer insulating film 212, etch-stopper film 213, second interconnect insulating film 216 and second protection film 217. Further, the isolated interconnect 270a constituted of the barrier film 220 and the interconnect metal film 223, as well as the concentrated interconnects 270b, 270c and 270d likewise constituted are formed through the etch-stopper film 213, the second interconnect insulating film 216 and the second protection film 217. The erosion region 271 is supposed to appear in the concentrated region where the concentrated interconnects 270b to 270d are disposed.

Now a method of manufacturing the semiconductor device according to this embodiment will be described. FIGS. 7A to 7D are schematic cross-sectional views showing a formation process of an upper interconnect layer 270 of the semiconductor device shown in FIG. 6.

In this embodiment, first a resist film 272 is formed on the second protection film 217. By a known lithography and etching technique, an isolated interconnect trench 273a, a concentrated interconnect trench 273b, a concentrated interconnect trench 273c and a concentrated interconnect trench 273d are formed through the second interconnect insulating film 216, the second protection film 217 and the resist film 272 (FIG. 7A). Meanwhile, it is also preferable to form an anti-reflection film (not shown) under the resist film 272 for better controlled patterning by the resist film 272. The anti-reflection film interleaved between layers can also serve to prevent penetration of the etch-stopper film 213.

Then the resist film 272 used for forming the isolated interconnect trench 273a and the concentrated interconnect trenches 273b to 273d is removed, and another resist film 274 is formed on the second protection film 217 so as to fill in the isolated interconnect trench 273a and the concentrated interconnect trenches 273b to 273d. A via hole 275 is then formed through the etch-stopper film 213, the interlayer insulating film 212 and the etch-stopper film 211 at a predetermined position on the resist film 274, by a known lithography and etching technique (FIG. 7B).

Thereafter the resist film 274 is removed. At this stage, the via hole 275 and the isolated interconnect trench 273a are successively formed (FIG. 7C). Then the barrier film 220 is formed by sputtering inside the via hole 275, the isolated interconnect trench 273a and the concentrated interconnect trench 273b, concentrated interconnect trench 273c and concentrated interconnect trench 273d. Following the above the interconnect metal film 223 is formed, for example by electrolytic plating, on the barrier film 220 so as to fill in the via hole 275, the isolated interconnect trench 273a and the concentrated interconnect trench 273b, concentrated interconnect trench 273c and concentrated interconnect trench 273d respectively (FIG. 7D). Then an excess of the barrier film 220 and of the interconnect metal film 223 formed outside the isolated interconnect trench 273a and the concentrated interconnect trenches 273b to 273d is removed by CMP. In this way the semiconductor device 200 including the isolated interconnect 270a and the concentrated interconnects 270b to 270d as shown in FIG. 6 is obtained. At this stage, in the concentrated region where the concentrated interconnect trenches 273b to 273d were formed, a portion of the second protection film 217 and of the second interconnect insulating film 216 is also removed, thereby forming the erosion region 271.

In this embodiment also, during the CMP process a portion of the second protection film 217 and of the second interconnect insulating film 216 is removed, and especially in the concentrated region where the concentrated interconnects 270b to 270d are formed the second protection film 217 and the second interconnect insulating film 216 are scraped off in a larger scale, than in a region around the isolated interconnect 270a. However since an L-Ox film which has high polishing resistance is used as the second interconnect insulating film 216 in this embodiment, dimensions of the erosion region 271 where the second protection film 217 and the second interconnect insulating film 216 are scraped off can be reduced.

Third Embodiment

The third embodiment also represents a case where the present invention is applied to formation of a multilayer interconnect structure by dual Damascene process, as in the second embodiment. The difference is that the "via-first" process is adopted as an example of forming an interconnect and a via. In this embodiment, the same numerals are given to components that are identical to those of the first and the second embodiments, and description thereof may be omitted.

In this embodiment also, the semiconductor device 200 has the same structure as that of the second embodiment shown in FIG. 6.

Hereunder a method of manufacturing the semiconductor device according to this embodiment will be described.

Figure 8A:
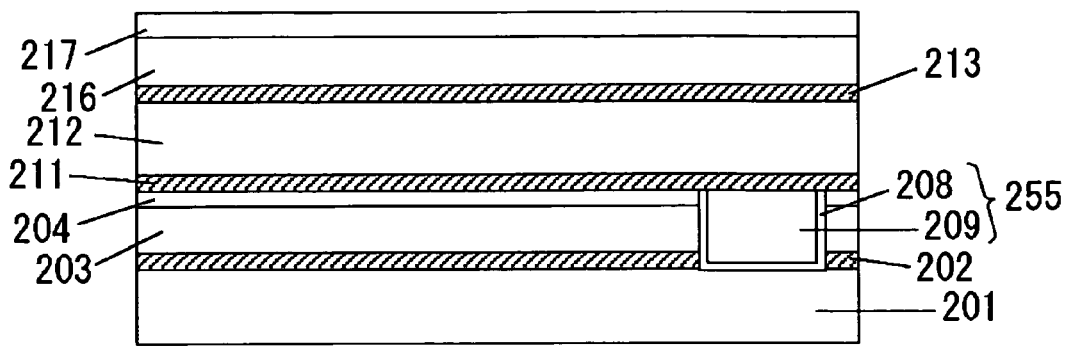
FIGS. 8A to 8C are schematic cross-sectional views showing another formation process of an upper interconnect layer of the semiconductor device of FIG. 6.
Figure 8B:
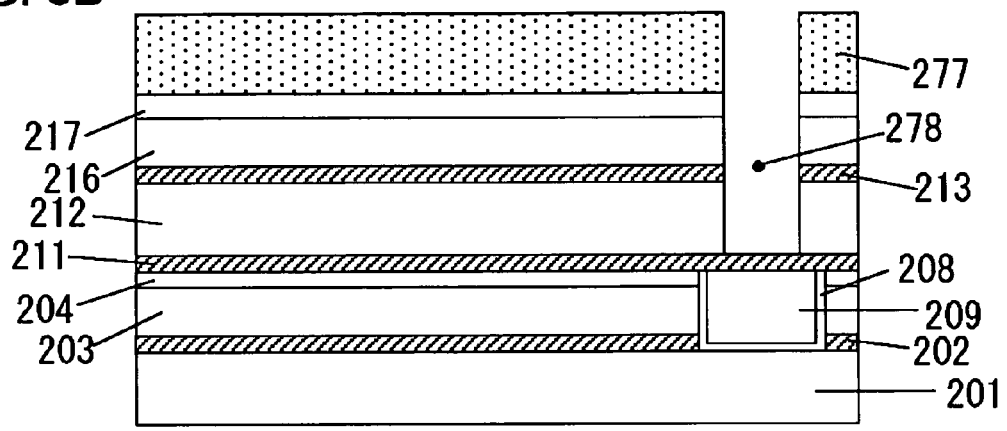
Figure 8C:
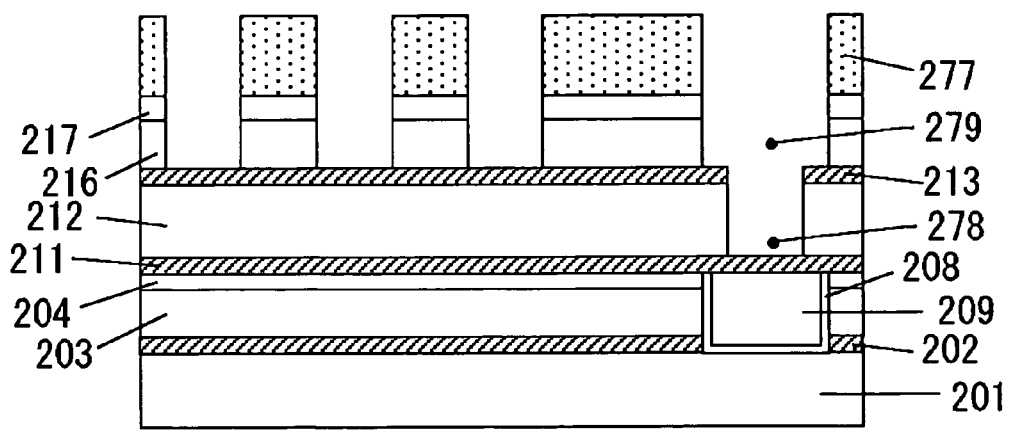

FIGS. 8A to 8C are schematic cross-sectional views showing another formation process of an upper interconnect layer 270 of the semiconductor device shown in FIG. 6.

First, the etch-stopper film 211, the interlayer insulating film 212, the second interconnect insulating film 216 and the second protection film 217 are deposited in this sequence on the lower interconnect 255 (FIG. 8A). During this process, it is preferable to perform CMP for planarizing the surface of the interlayer insulating film 212 upon forming the same, in order to level off an uneven surface formed through a preceding CMP process for forming the lower interconnect 255. As a result, the respective layers can be maintained sufficiently planarized through the formation process of the multilayer interconnect structure, thereby enabling stable manufacturing of the semiconductor device at a high precision level.

Then a resist film 277 is formed on the second protection film 217. A via hole 278 is then formed through the interlayer insulating film 212, the etch-stopper film 213, the second interconnect insulating film 216 and the second protection film 217 by a known lithography and etching technique (FIG. 8B). Meanwhile, the etch-stopper film 211 is provided for stopping a progress of etching for forming the via hole 278.

After the above the resist film 277 utilized for defining the via hole 278 is partly removed, and then an interconnect trench 279 is formed through the second interconnect insulating film 216 and the second protection film 217, by a known lithography and etching technique (FIG. 8C).

Thereafter the resist film 277 utilized for defining the interconnect trench 279 is entirely removed, and the etch-stopper film 211 at a bottom portion of the via hole 278 is removed by etching. Then the barrier film 220 and the interconnect metal film 223 are formed in a similar manner to the method described in the second embodiment referring to FIG. 7D. Finally an excess of the barrier film 220 and of the interconnect metal film 223 formed outside the interconnect trench 279 is removed by CMP. In this way a semiconductor device similar to the one shown in FIG. 6 is obtained.

According to this embodiment also, since an L-Ox film which has high polishing resistance is used as the second interconnect insulating film 216, dimensions of the erosion region 271 in the concentrated region where the second protection film 217 and the second interconnect insulating film 216 are scraped off can be reduced.

Fourth Embodiment

The fourth embodiment also represents a case where the present invention is applied to formation of a multilayer interconnect structure by dual Damascene process, as in the second and third embodiments. The difference is that the so-called "middle-first" process is adopted as an example of forming an interconnect and a via. In this embodiment, the same numerals are given to components that are identical to those of the first to the third embodiments, and description thereof may be omitted.

In this embodiment also, the semiconductor device 200 has the same structure as that of the second embodiment shown in FIG. 6.

Hereunder a method of manufacturing the semiconductor device according to this embodiment will be described. FIGS. 9A to 9D are schematic cross-sectional views showing another formation process of an upper interconnect layer 270 of the semiconductor device shown in FIG. 6.

Figure 9A:
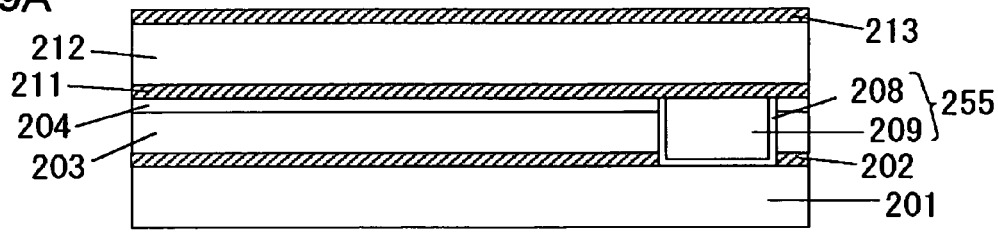
FIGS. 9A to 9D are schematic cross-sectional views showing still another formation process of an upper interconnect layer of the semiconductor device of FIG. 6.

First, the etch-stopper film 211, the interlayer insulating film 212 and the etch-stopper film 213 are sequentially deposited on the lower interconnect 255 (FIG. 9A).

Figure 9B:
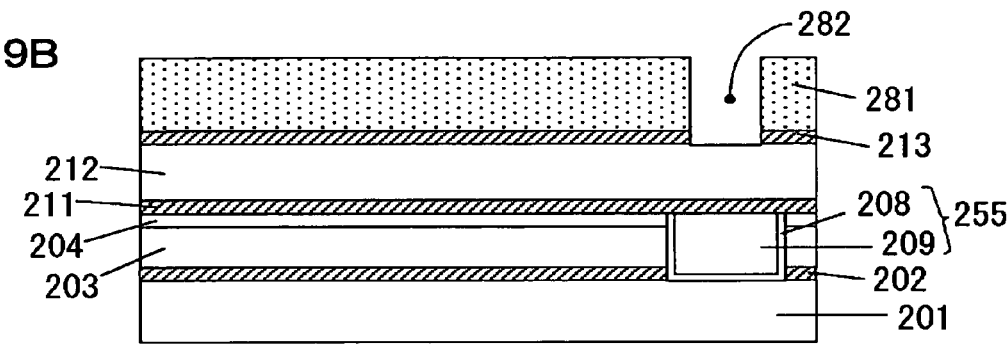

A resist film 281 is then formed on the etch-stopper film 213, after which a portion of the etch-stopper film 213 where a via hole 282 is to be located is removed by a known lithography and etching technique (FIG. 9B).

Figure 9C:
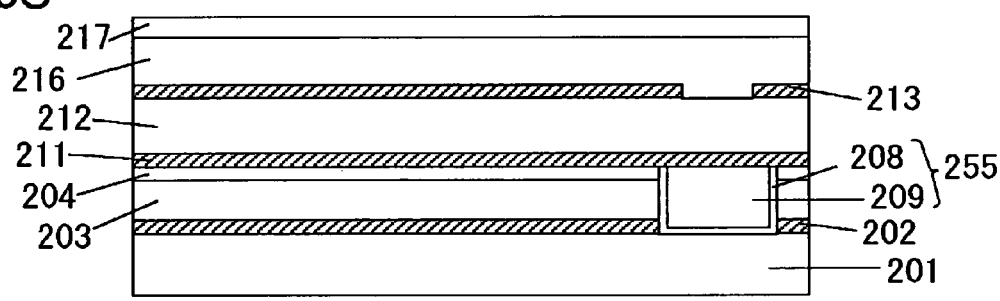

Then the resist film 281 is removed, and the second interconnect insulating film 216 and the second protection film 217 are formed on the etch-stopper film 213 (FIG. 9C).

Figure 9D:
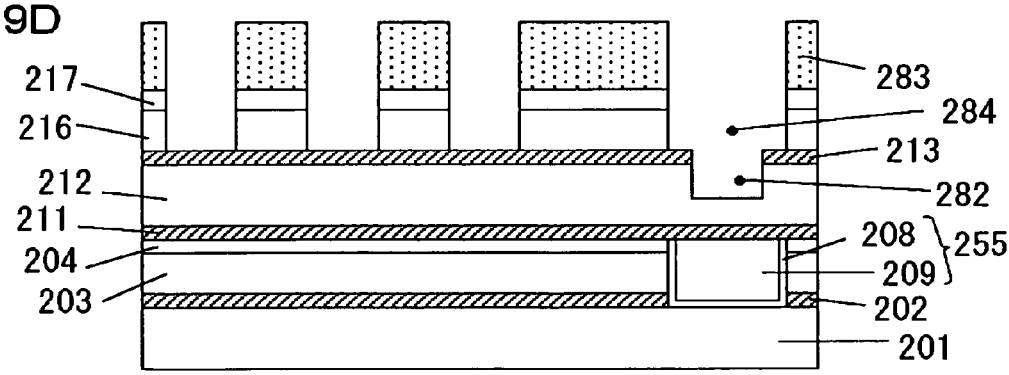

Thereafter a resist film 283 is formed on the second protection film 217, following which an interconnect trench 284 is formed through the second interconnect insulating film 216 and the second protection film 217 by a known lithography and etching technique. During this process, it is preferable to continue the etching to define the via hole 282 after the interconnect trench 284 being defined with the progress of the etching has reached the etch-stopper film 213 (FIG. 9D). Here, the barrier film 208 serves to stop the progress of etching for forming the via hole 282. Then the etch-stopper film 211 is removed and the barrier film 220 and the interconnect metal film 223 are formed as in the third embodiment. Finally an excess of the barrier film 220 and of the interconnect metal film 223 formed outside the interconnect trench 284 is removed by CMP. In this way a semiconductor device similar to the one shown in FIG. 6 is obtained.

According to this embodiment also, since an L-Ox film which has high polishing resistance is used as the second interconnect insulating film 216, dimensions of the erosion region 271 in the concentrated region where the second protection film 217 and the second interconnect insulating film 216 are scraped off can be reduced.

EXAMPLE

A semiconductor device of a constitution shown in FIG. 4 has been actually manufactured by single Damascene process as described in the first embodiment. In this case an $SiO_2$ film (thickness 80 nm) was used as the second protection film 217, and an L-Ox film (thickness 200 nm) as the second interconnect insulating film 216.

COMPARATIVE EXAMPLE

Another semiconductor device has been manufactured, which is the same as the working sample except that an HSQ film (thickness 200 nm) was used as the second interconnect insulating film 216.

Figure 10:
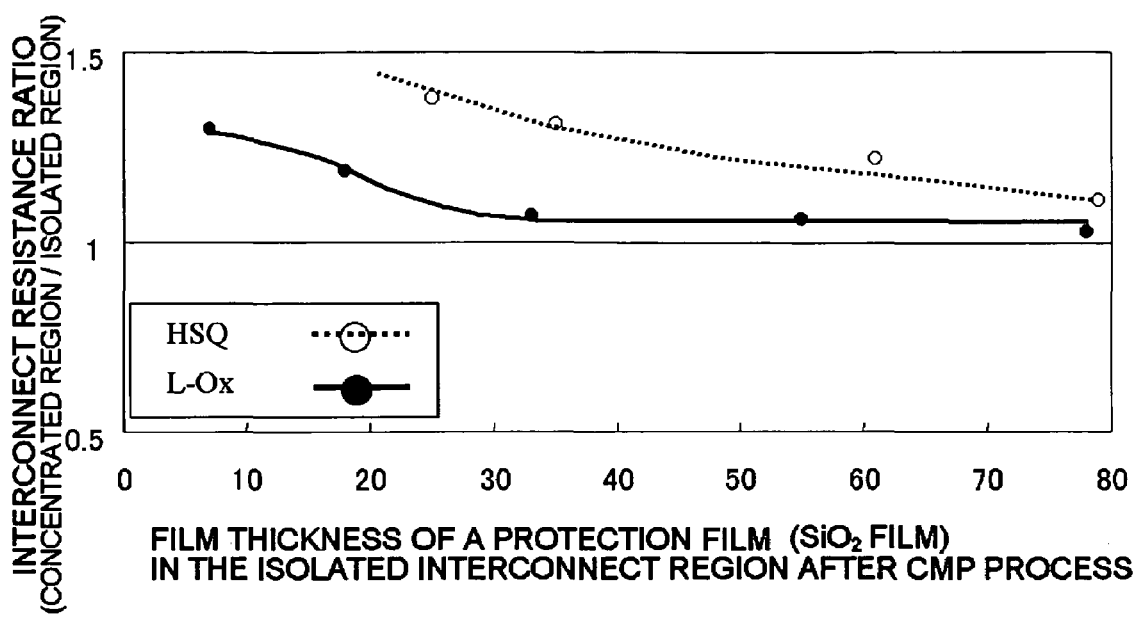
FIG. 10 is a line graph showing a relation between an interconnect resistance ratio and a film thickness of a protection layer ($SiO_2$ film) in an isolated interconnect region after a CMP process, measured upon manufacturing a example of the semiconductor device.

FIG. 10 is a line graph showing a relation between a ratio of interconnect resistance in the concentrated region where the interconnects are closely disposed against interconnect resistance in the isolated region where the isolated interconnect is formed (interconnect resistance ratio), and a film thickness of the protection film ($SiO_2$ film) in the isolated interconnect region after the CMP process, measured upon manufacturing the semiconductor device examples. Meanwhile, the concentrated region was constituted such that an interval between interconnects became 0.20 μm, and the isolated region was constituted such that an interval between interconnects became 5.00 μm.

Regarding the example, the interconnect resistance ratio increases when a thickness of the protection film ($SiO_2$ film) in the isolated interconnect region is less than approx. 20 nm, even though the L-Ox film is used as the interconnect insulating film. The reason is considered to be that erosion takes place in the concentrated region unless the protection film has a certain thickness, thereby increasing interconnect capacitance. Accordingly, it is preferable to form the protection film on the interconnect insulating film in a thickness corresponding to at least 10% of a thickness of the interconnect insulating film, in order to restrain an increase of the interconnect capacitance and stabilize the interconnect resistance and capacitance. On the other hand, from the viewpoint of maintaining a specific dielectric constant of the interconnect insulating as low as possible, it is preferable to form the protection film on the interconnect insulating film in a thickness corresponding to 60% at maximum of a thickness of the interconnect insulating film.

Meanwhile regarding the comparative example, in which an HSQ film having a cage-type molecular structure as the interconnect insulating film, the interconnect resistance ratio is high even when a thickness of the protection film ($SiO_2$ film) in the isolated region is as thick as 70 nm. In view of this it is understood that, in case of employing an HSQ film as the interconnect insulating film, stabilized interconnect resistance and interconnect capacitance cannot be obtained despite increasing the thickness of the protection film.

Further, in view of the data shown in FIG. 2 it is understood that the L-Ox film is, because of its ladder-type molecular structure, superior in chemical resistance and mechanical strength to the HSQ film which has a cage-type molecular structure, and that therefore loss of the interconnect insulating film constituted of an L-Ox film is minimal even in case where the $SiO_2$ film has been entirely removed by erosion caused in the concentrated region.

Figure 1A:
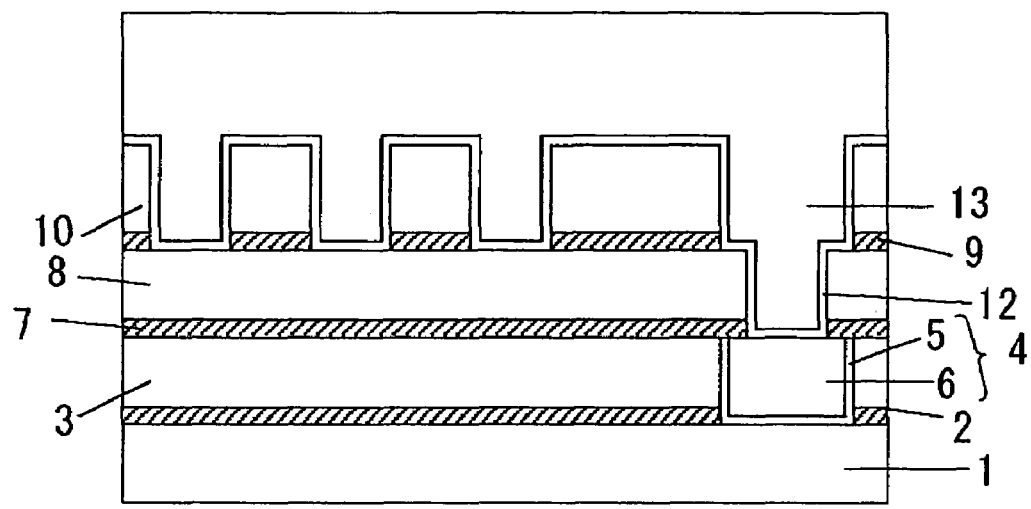
FIGS. 1A and 1B are schematic cross-sectional views showing a conventional semiconductor device.
Figure 1B:
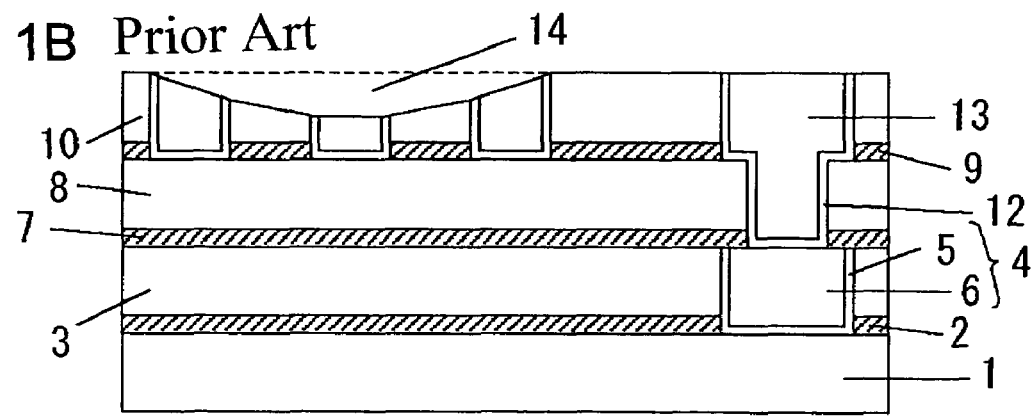
Figure 3A:
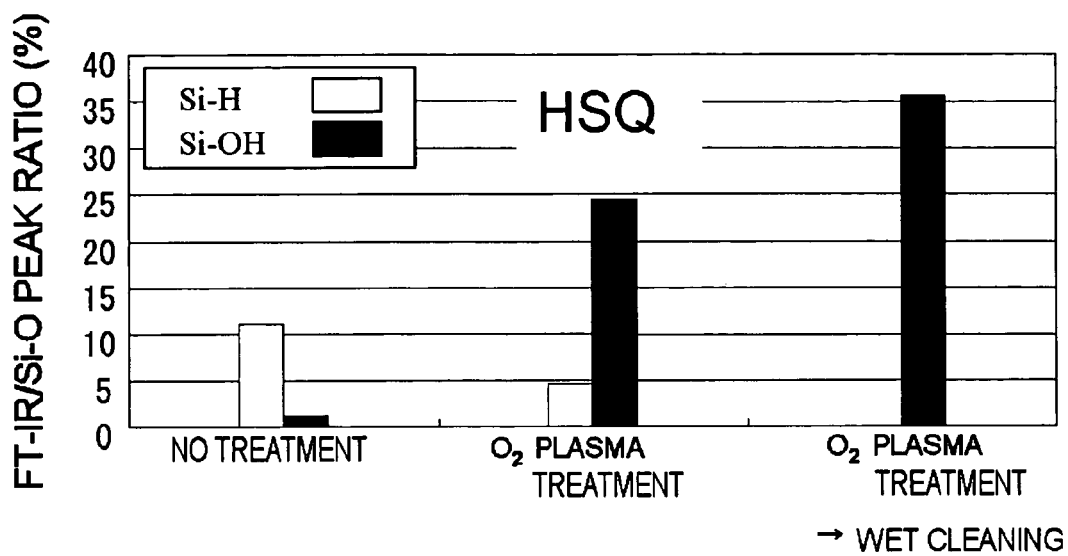
FIGS. 3A and 3B are bar graphs showing changes of an HSQ film having a cage-type molecular structure and an L-Ox film against various kinds of treatments.
Figure 3B:
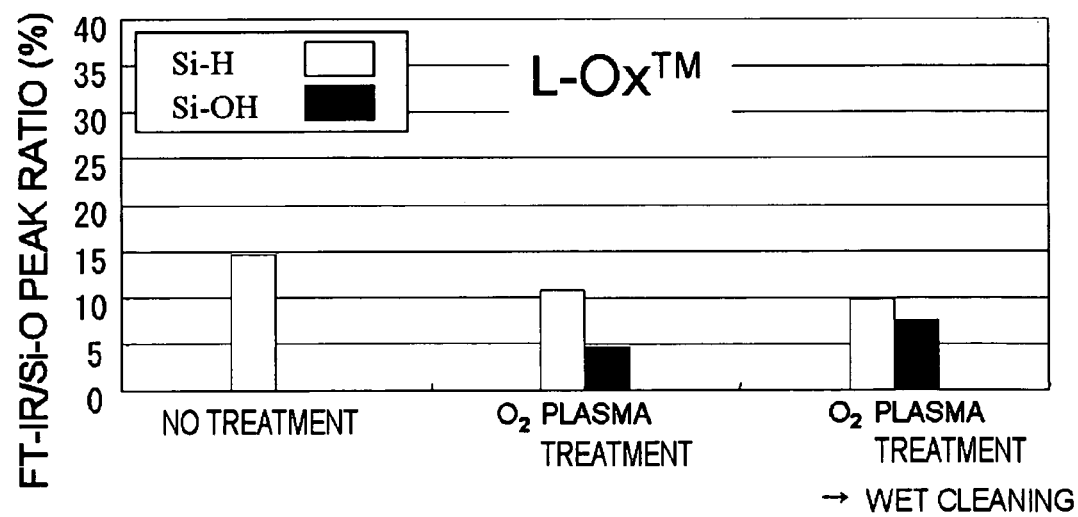

Furthermore in view of the data shown in FIGS. 3A and 3B as well as in FIGS. 11 to 15, it is understood that the L-Ox film having a ladder-type molecular structure is chemically more stable than the HSQ film having a cage-type molecular structure.

What is claimed is:

1. A semiconductor device, comprising:
a semiconductor substrate;
a low dielectric constant film constituted essentially of a ladder-type hydrogen siloxane provided on said semiconductor substrate wherein said ladder-type hydrogen siloxane has a refractive index not less than 1.38 but not greater than 1.40 at a wavelength of 633 nm;
a protection film provided on said low dielectric constant film; and
a metal interconnect formed in said low dielectric constant film and said protective film.

2. A semiconductor device, comprising:
a semiconductor substrate;
a low dielectric constant film constituted essentially of a ladder-type hydrogen siloxane provided on said semiconductor substrate wherein said ladder-type hydrogen siloxane has a density not less than 1.50 $g/cm^3$ but not greater than 1.58 $g/cm^3$;
a protection film provided on said low dielectric constant film; and
a metal interconnect formed in said low dielectric constant film and said protective film.

3. A semiconductor device. comprising:
a semiconductor substrate;
a low dielectric constant film consisting essentially of a ladder-type hydrogen siloxane provided on said semiconductor substrate;
a protection film consisting essentially of a silicon oxide film provided on said low dielectric constant film; and
a metal interconnect formed in said low dielectric constant film and said protective film;
wherein a plurality of said metal interconnects is provided so as to form an isolated region where one of said plurality of metal interconnects is separately located and a concentrated region where the other metal interconnects are closely disposed to one another.

4. A semiconductor device, comprising:
a semiconductor substrate;
a low dielectric constant film constituted essentially of a ladder-type hydrogen siloxane provided on said semiconductor substrate;
a protection film provided on said low dielectric constant film; and
a plurality of metal interconnects formed in said low dielectric constant film and said protective film wherein said plurality of metal interconnects is provided so as to form an isolated region where one of said plurality of metal interconnects is separately located and a concentrated region where the other metal interconnects are closely disposed to one another, and
wherein said plurality of metal interconnects in the concentrated region is disposed such that an interval between substantially parallel portions of neighboring metal interconnects is not greater than a double of a width of the respective metal interconnects.

5. A semiconductor device, comprising:
a semiconductor substrate;
a low dielectric constant film constituted essentially of a ladder-type hydrogen siloxane provided on said semiconductor substrate;
a protection film provided on said low dielectric constant film wherein said protection film is formed such that a film thickness thereof at its thickest portion is in a range of 10% to 30% of a film thickness of said low dielectric constant film at its thickest portion; and
a metal interconnect formed in said low dielectric constant film and said protective film.

6. A semiconductor device, comprising:
a semiconductor substrate;
a low dielectric constant film consisting essentially of a ladder-type hydrogen siloxane provided on said semiconductor substrate;
a protection film consisting essentially of a silicon oxide film provided on said low dielectric constant film; and
a metal interconnect formed in said low dielectric constant film and said protective film;
wherein said ladder-type hydrogen siloxane has a refractive index not less than 1.38 but not greater than 1.40 at a wavelength of 633 nm.

7. A semiconductor substrate;
a low dielectric constant film consisting essentially of a ladder-type hydrogen siloxane provided on said semiconductor substrate;
a protection fitm consisting essentially of a silicon oxide film provided on said low dielectric constant film; and
a metal interconnect formed in said low dielectric constant film and said protective film;
wherein said ladder-type hydrogen siloxane has a density not less than 1.50 $g/cm^3$ but not greater than 1.58 $g/cm^3$.

8. A semiconductor substrate;
a low dielectric constant film consisting essentially of a ladder-type hydrogen siloxane provided on said semiconductor substrate;
a protection film consisting essentially of a silicon oxide film provided on said low dielectric constant film; and a metal interconnect formed in said low dielectric constant film and said protective film;

wherein a plurality of said metal interconnects is provided so as to form an isolated region where one of said plurality of metal interconnects is separately located and a concentrated region where the other metal interconnects are closely disposed to one another; and said plurality of metal interconnects in the concentrated region is disposed such that an interval between substantially parallel portions of neighboring metal interconnects is not greater than a double of a width of the respective metal interconnects.

9. A semiconductor substrate;

a low dielectric constant film consisting essentially of a ladder-type hydrogen siloxane provided on said semiconductor substrate;

a protection film consisting essentially of a silicon oxide film provided on said low dielectric constant film; and a metal interconnect formed in said low dielectric constant film and said protective film;

wherein said protection film is formed such that a film thickness thereof at its thickest portion is in a range of 10% to 30% of a film thickness of said low dielectric constant film at its thickest portion.

* * * * *